(12) United States Patent
Omata et al.

(10) Patent No.: US 9,819,293 B2
(45) Date of Patent: Nov. 14, 2017

(54) VOLTAGE SENSOR ABNORMALITY DIAGNOSIS APPARATUS

(71) Applicant: DENSO CORPORATION, Kariya, Aichi-pref. (JP)

(72) Inventors: Ryuji Omata, Kariya (JP); Yuri Murata, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/348,296

(22) Filed: Nov. 10, 2016

(65) Prior Publication Data

US 2017/0163195 A1 Jun. 8, 2017

(30) Foreign Application Priority Data

Nov. 10, 2015 (JP) ................. 2015-220542

(51) Int. Cl.
*H02P 21/00* (2016.01)
*H02P 27/08* (2006.01)
(Continued)

(52) U.S. Cl.
CPC ............ *H02P 21/50* (2016.02); *G01R 31/007* (2013.01); *G01R 31/2829* (2013.01); *H02P 27/08* (2013.01); *H02P 29/024* (2013.01)

(58) Field of Classification Search
CPC ........ B62D 5/0484; B62D 5/049; B60K 6/20; B60K 6/28; B60K 6/365; B60W 10/08;
(Continued)

(56) References Cited

U.S. PATENT DOCUMENTS 6,795,762 B2 * 9/2004 Itoh ................. B62D 5/049
180/421
8,148,993 B2 * 4/2012 Yamabe ............. B60K 6/365
324/433

(Continued)

FOREIGN PATENT DOCUMENTS

JP           4793058 B2    10/2011
JP       2015-050895 A     3/2015
(Continued)

*Primary Examiner* — Paul Ip
(74) *Attorney, Agent, or Firm* — Oliff PLC (57) ABSTRACT

A voltage sensor abnormality diagnosis apparatus is applied to a motor controller operating switching of inverter by a switching signal for complementary on and off and diagnoses abnormality of input voltage sensor. An input voltage estimated value calculation section calculates input voltage estimated value by multiplying voltage command amplitude deviation by conversion coefficient, the voltage command amplitude deviation being obtained by subtracting theoretical voltage command amplitude, which is amplitude of theoretical voltage command calculated by using a motor model expression, from a control voltage command amplitude, which is an amplitude of a control voltage command calculated by feedback control and has been corrected by the dead time correction amount. An abnormality determination section determines that the input voltage sensor is abnormal if an absolute value of a difference between an input voltage sensor value and the input voltage estimated value is larger than a voltage threshold value.

7 Claims, 6 Drawing Sheets

(51) Int. Cl.
*H02P 29/024* (2016.01)
*G01R 31/00* (2006.01)
*G01R 31/28* (2006.01)

(58) Field of Classification Search
CPC ...... B60W 10/26; B60W 20/00; B60W 20/50; B60W 2510/242; B60W 2510/244; B60W 2510/246; B60W 2510/248; B60W 50/0205
USPC ......... 318/400.02, 400.18, 430; 701/31.4, 43
See application file for complete search history.

(56) References Cited

U.S. PATENT DOCUMENTS

| | | | |
|---|---|---|---|
| 2003/0120407 A1* | 6/2003 | Itoh | B62D 5/0484 701/43 |
| 2008/0125932 A1* | 5/2008 | Yamabe | B60K 6/365 701/31.4 |
| 2013/0320893 A1* | 12/2013 | Aoki | B62D 5/0484 318/400.18 |
| 2017/0131378 A1 | 5/2017 | Murata | |
| 2017/0131379 A1 | 5/2017 | Omata et al. | |

FOREIGN PATENT DOCUMENTS

| | | |
|---|---|---|
| JP | 2015-091144 A | 5/2015 |
| JP | 2015-162977 A | 9/2015 |
| JP | 2017-093149 A | 5/2017 |

\* cited by examiner

VOLTAGE SENSOR ABNORMALITY DIAGNOSIS APPARATUS

CROSS-REFERENCE TO RELATED APPLICATION

This application is based on and claims the benefit of priority from earlier Japanese Patent Application No. 2015-220542 filed Nov. 10, 2015, the description of which is incorporated herein by reference.

BACKGROUND

Technical Field

The present invention relates to a voltage sensor abnormality diagnosis apparatus.

Related Art

Conventionally, apparatuses are known which diagnose an abnormality of a voltage sensor in a system converting DC voltage of a battery to AC voltage by using an inverter to supply the AC voltage to an AC motor.

For example, the fault diagnosis apparatus for voltage sensors disclosed in Japanese Patent No.4793058 determines that any of the voltage sensors has failed if the absolute value of the difference between a battery voltage VBf detected by a battery voltage sensor and an inverter voltage VIf detected by an inverter voltage sensor is larger than a predetermined value.

In addition, the fault diagnosis apparatus compares a first output estimated value, which is the three-phase sum of products of phase currents and phase voltages of individual phases, with a second output estimated value, which is calculated based on the product of torque and the number of revolutions of a motor. If the absolute value of the difference between the output estimated values is larger than a predetermined value, the fault diagnosis apparatus determines that the inverter voltage sensor has failed.

According to the technique in Japanese Patent No.4793058, two output estimated values are compared with each other, and voltage values are not directly evaluated. If a determination threshold value is set to be constant regardless of voltage values, the degree of the range, which is the determination threshold value or less and in which it is determined to be normal, varies depending on the voltage values. Hence, it is difficult to secure uniform accuracy in determining an abnormality in a wide voltage region. In addition, variably setting the determination threshold value depending on the voltage value increases a calculation load.

Furthermore, in a system in which output voltage of a battery is directly inputted to an inverter, the battery voltage and the inverter input voltage are approximately equal to each other when wiring loss is ignored. Hence, both of the battery voltage sensor and the inverter input voltage sensor are not required to be provided. However, according to the technique in Japanese Patent No.4793058, the battery voltage sensor is required to be provided only for detecting an abnormality of the inverter voltage sensor and to obtain a battery voltage signal from a vehicle controller by a voltage sensor diagnosis section of a motor controller.

SUMMARY

An embodiment provides a voltage sensor abnormality diagnosis apparatus that can determine an abnormality of an inverter input voltage sensor in a wide voltage region with high accuracy.

A voltage sensor abnormality diagnosis apparatus of an embodiment is applied to a motor controller controlling current application to a three phase or more multiple AC motor driven by AC power supplied from an inverter connected to a DC power, and diagnoses an abnormality of an input voltage sensor detecting an inverter input voltage inputted to the inverter.

The motor controller operates switching of the inverter by a switching signal, which is calculated based on a voltage command calculated by current feedback control and complementarily turns on and off a pair of switching elements of a plurality of upper and lower arms configuring the inverter in a switching cycle.

The voltage sensor abnormality diagnosis apparatus includes an input voltage estimated value calculation section that calculates an input voltage estimated value by multiplying a voltage command amplitude deviation by a conversion coefficient, the voltage command amplitude deviation being obtained by subtracting a theoretical voltage command amplitude, which is an amplitude of a theoretical voltage command calculated by using a motor model expression, from a control voltage command amplitude, which is an amplitude of a control voltage command calculated by feedback control and has been corrected by the correction amount of voltage in dead time provided between on periods of the pair of the switching elements, and an abnormality determination section that determines that the input voltage sensor is abnormal if an absolute value of a difference between the input voltage estimated value and an input voltage is sensor value, which is a detection value of the input voltage sensor, is larger than a voltage threshold value.

DETAILED DESCRIPTION OF THE PREFERRED EMBODIMENTS

Hereinafter, an embodiment of a voltage sensor abnormality diagnosis apparatus will be described with reference to the drawings. The voltage sensor abnormality diagnosis apparatus of the embodiment diagnoses an abnormality of an input voltage sensor, which detects an inverter input voltage, in a system that drives a motor generator (hereinafter, "MG"), which is a power source of a hybrid car or an electric car. An MG and an MG controller of the embodiment correspond to an AC motor and a motor controller.

(Embodiment)
[System Configuration]

Figure 1:
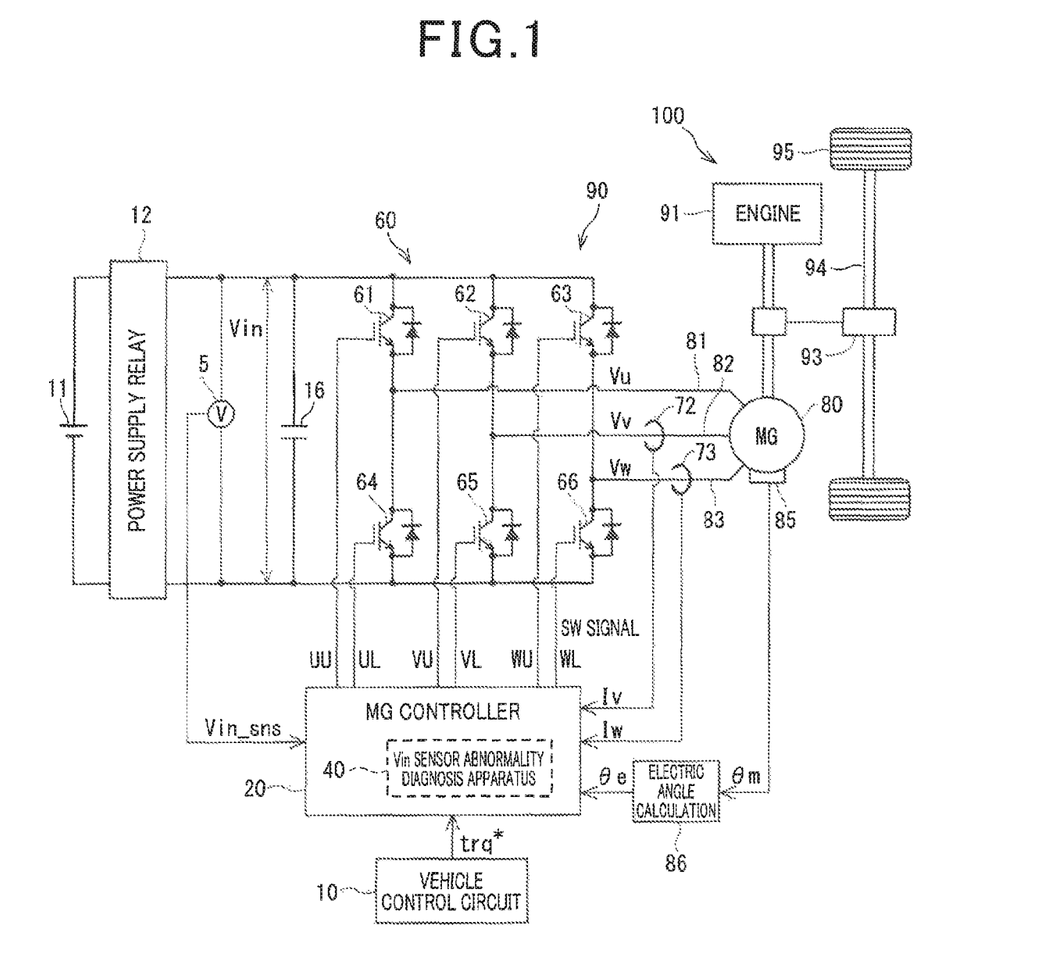
FIG. 1 is a diagram showing a schematic configuration of an MG drive system to which a voltage sensor abnormality diagnosis apparatus of an embodiment is applied.

First, the whole configuration of an MG drive system is described with reference to FIG. 1. FIG. 1 illustrates a system including one MG. An MG drive system 90 installed in a hybrid car 100 converts DC power of a battery 11 serving as a DC power supply to three-phase AC power by using an inverter 60, and supplies the three-phase AC power to an MG 80 to drive the MG 80.

The battery 11 is a chargeable and dischargeable secondary battery such as a nickel hydride battery or a lithium-ion battery. Note that, instead of a battery, an electric double layer capacitor or the like may be used as a DC power source.

A power supply relay 12 can block power supply from the battery 11 to the inverter 60. In other words, while the power supply relay 12 is closed, the inverter 60 can be driven.

The system does not include a step-up converter between the battery 11 and the inverter 60. Output voltage of the battery 11 is directly applied to the inverter 60. A smoothing capacitor 16 is provided at the input portion of the inverter 60 to smooth an inverter input voltage Vin. An input voltage sensor 5 detects the inverter input voltage Vin. Hereinafter, a detection value of the input voltage sensor 5 is referred to as an input voltage sensor value Vi_sns.

In the inverter 60, six switching elements 61 to 66 of upper and lower arms are connected in a bridge form. Specifically, the switching elements 61, 62, and 63 are respectively switching elements of a U phase, a V phase, and a W phase of the upper arm. The switching elements 64, 65, and 66 are respectively switching elements of a U phase, a V phase, and a W phase of the lower arm. Pairs of the switching elements 61 and 64, the switching elements 62 and 65, and the switching elements 63 and 66 of the phases are operated so as to be complementarily turned on and off in switching cycles. The switching elements 61 to 66 are configured by, for example, IGBTs, and are connected in parallel with freewheel diodes allowing a current to flow from a low electric potential side to a high electric potential side.

The inverter 60 converts DC power to three-phase AC power due to operations of the switching elements 61 to 66 in accordance with switching signals (SW signals, in the figure) UU, UL, VU, VL, WU, and WL received from an MG controller 20. Then, the inverter 60 applies phase voltages Vu, Vv, and Vw corresponding to voltage commands calculated by the MG controller 20 to respective phase windings 81, 82, and 83 of the MG 80.

The MG 80 is, for example, a permanent magnet synchronous three-phase AC motor. In the present embodiment, the MG 80 is installed in the hybrid car 100 including an engine 91. The MG 80 includes both a function of a motor generating torque for driving wheels 95 and a function of a generator recovering energy of torque, which is transferred from the engine 91 to the driving wheels 95, by power generation. The MG 80 is connected to an axle 94 via gears 93 such as a gearbox. The torque generated by the MG 80 rotates the axle 94 via the gears 93 to drive the driving wheels 95.

Current paths connected to two-phase windings included in three-phase windings 81, 82, and 83 of the MG 80 are provided with current sensors detecting phase currents. In FIG. 1, on the current paths connected to the V-phase winding 82 and the W-phase winding 83, current sensors 72 and 73 for detecting phase currents Iv and Iw are respectively provided.

A rotation angle sensor 85 is, for example, a resolver. An electrical angle calculation section 86 calculates an electrical angle θe from a resolver angle θm. In FIG. 1, although the electrical angle calculation section 86 is provided outside the MG controller 20, the electrical angle θe may be calculated inside the MG controller 20.

A vehicle control circuit 10 (i.e. HV-ECU) receives signals such as an accelerator signal, a brake signal, a shift signal, and a vehicle speed signal and information of another ECU. The vehicle control circuit 10 comprehensively determines a driving state of the vehicle based on the obtained information to control the drive of the vehicle. Other ECUs include, in addition to the MG controller 20 (i.e. MG-ECU), a battery ECU controlling the battery 11 and an engine ECU controlling the engine 91, In FIG. 1, the battery ECU and the engine ECU are not shown.

Each of the ECUs is configured by a microcomputer or the like, and includes therein a CPU, a ROM, an I/O, a bus line connecting them, and the like. Each of the ECUs performs controls by a software process, which is executed by executing a predetermined stored program by the CPU, or a hardware process executed by a dedicated electronic circuit.

The MG controller 20 calculates a voltage command by current feedback control based on a torque command trq* received from the vehicle control circuit 10. Then, the MG controller 20 outputs switching signals UU, UL, VU, VL, WU, and WL based on the voltage command to the inverter 60 to operate the six switching elements 61 to 66, thereby controlling current application to the MG 80, Accordingly, the MG 80 outputs torque in response to the torque command trq*.

Note that when a modulation factor is calculated in the current application control by the MG controller 20, information of the input voltage sensor value Vi_sns of the input voltage sensor 5 is used. If an abnormality occurs in the input voltage sensor 5, and the input voltage sensor value Vi_sns is displaced from the real value, the current application control for the MG 80 cannot be performed normally.

Thus, the MG controller 20 includes a voltage sensor abnormality diagnosis apparatus 40 diagnosing an abnormality of the input voltage sensor 5, Note that since only the input voltage sensor 5 is described herein as a voltage sensor, the simple designation "voltage sensor abnormality diagnosis apparatus" is used. In addition, in the figures, the input voltage sensor is also referred to as a Vin sensor.

While a current is applied to the MG 80, the voltage sensor abnormality diagnosis apparatus 40 always diagnoses an abnormality of the input voltage sensor 5.

Meanwhile, although abnormalities of a voltage sensor typically include an abnormality in which an output sticks to 0 or an upper value, this sticking abnormality can be easily determined by known techniques. In contrast, it is difficult to determine output characteristic abnormalities, such as a gain abnormality or an offset abnormality, in which a sensor value is displaced from the real value by, for example, several to several tens %.

Thus, in the present embodiment, assuming that the sticking abnormality has already been removed by the initial diagnosis,' output characteristic abnormalities, such as a gain abnormality or an offset abnormality, are targeted for diagnosis.

[Configurations and Functions of the MG Controller and the Voltage Sensor Abnormality Diagnosis Apparatus]

Figure 2:
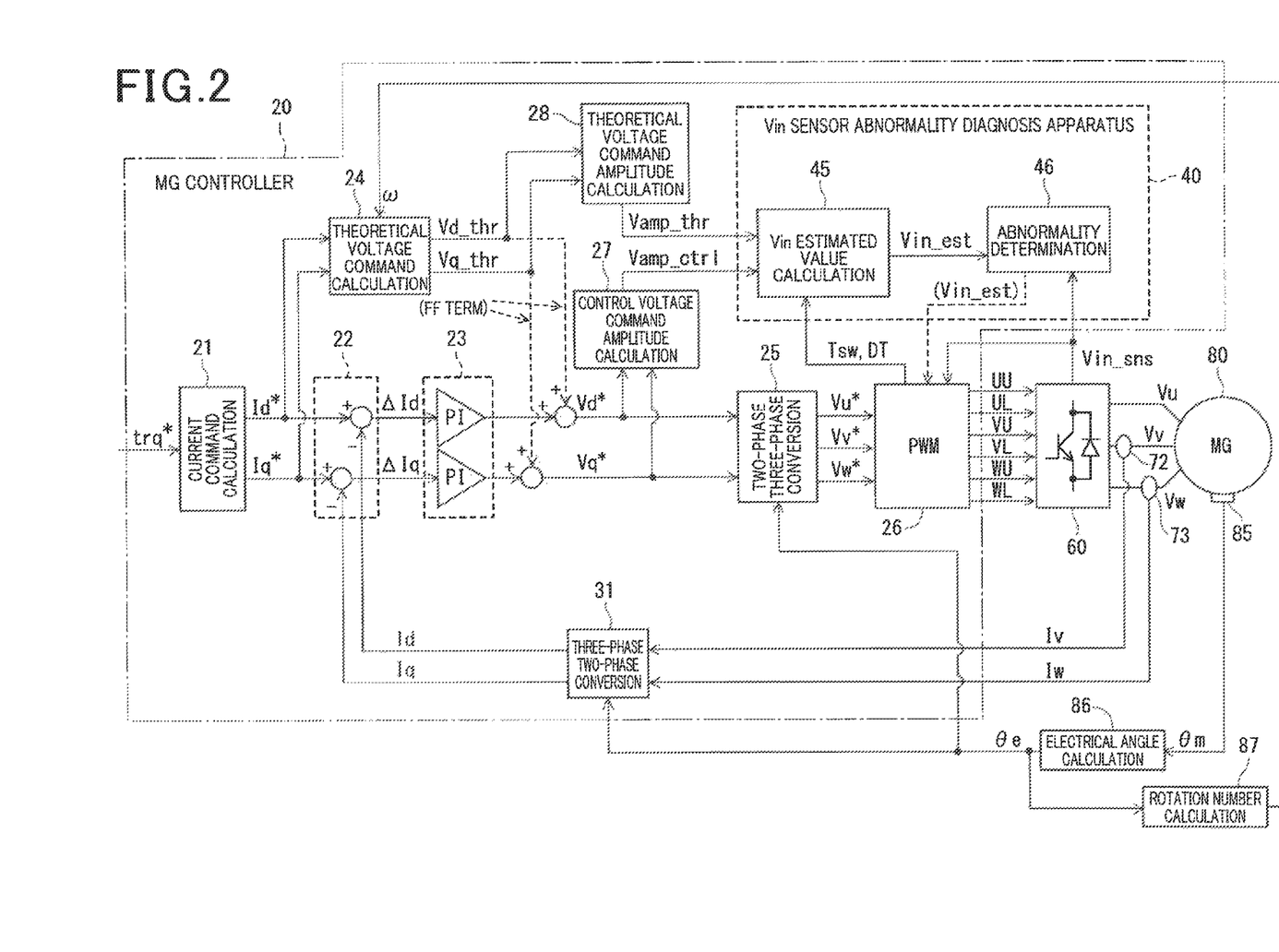
FIG. 2 is a control block diagram of an MG controller according to the embodiment.

FIG. 2 shows configurations of the MG controller 20 and the voltage sensor abnormality diagnosis apparatus 40 of the embodiment. The MG controller 20 has, as typical elements for current feedback control and PWM control, a current command calculation section 21, a current subtracter 22, a voltage command calculation section 23, two-phase to three-phase converter 25, a PWM signal generator 26, and a three-phase to two-phase converter 31.

In addition, the MG controller 20 has, as specific elements of the present embodiment, a theoretical voltage command calculation section 24, a control voltage command amplitude calculation section 27, and a theoretical voltage command amplitude calculation section 28. In FIG. 2, although these three blocks are shown outside the voltage sensor abnormality diagnosis apparatus 40, one or all of the three blocks may be included in the voltage sensor abnormality diagnosis apparatus 40.

The MG controller 20 performs current feedback control and PWM control for switching operations of the inverter 60. In addition, in the current feedback control, vector control using the dq axes of a to rotary coordinate system is performed. Since these motor control techniques are known, the detailed descriptions thereof are omitted. In addition, in contexts in which current and voltage commands of the dq axes can be identified from common general technical knowledge, the wording "dq axes" is appropriately omitted.

First, typical configurations of current feedback control and PWM control are described.

The current command calculation section 21 calculates dq axis current commands Id* and Iq* by using maps and expressions based on a torque command trq* received from the vehicle control circuit 10.

The current subtracter 22 calculates current deviations ΔId and ΔIq between the dq axis current commands Id* and Iq* and dq axis currents Id and Iq fed back from the three-phase to two-phase converter 31.

The voltage command calculation section 23 calculates dq axis voltage commands Vd* and Vq* by PI calculation so that the current deviations ΔId and ΔIq converge to 0. Specifically, in the present embodiment, the voltage commands Vd* and Vq* calculated by the voltage command calculation section 23 are referred to as current voltage commands to distinguish them from theoretical voltage commands described later.

The two-phase to three-phase converter 25 converts the dq axis voltage commands Vd* and Vq* to three phase voltage commands Vu*, Vv*, and Vw* based on the electrical angle θe.

The PWM signal generator 26 generates the switching signals UU, UL, VU, VL, WU, and WL for operating respective switching elements 61 to 66 of the inverter 60 based on the three phase voltage commands Vu*, Vv*, and Vw* and the input voltage sensor value Vi_sns. In this process, the PWM signal generator 26 calculates a modulation factor and further calculates a command Duty specifying the ratio of an on time to the switching cycle, Under the typical switching control of the inverter 60, a dead time is provided between on periods of the pair of the switching elements to prevent the pair of the switching elements of the upper and lower arms, which are complementarily turned on and off, from being simultaneously turned on to cause an overcurrent. During the dead time, both elements of the pair of the switching elements are turned off.

Figure 3:
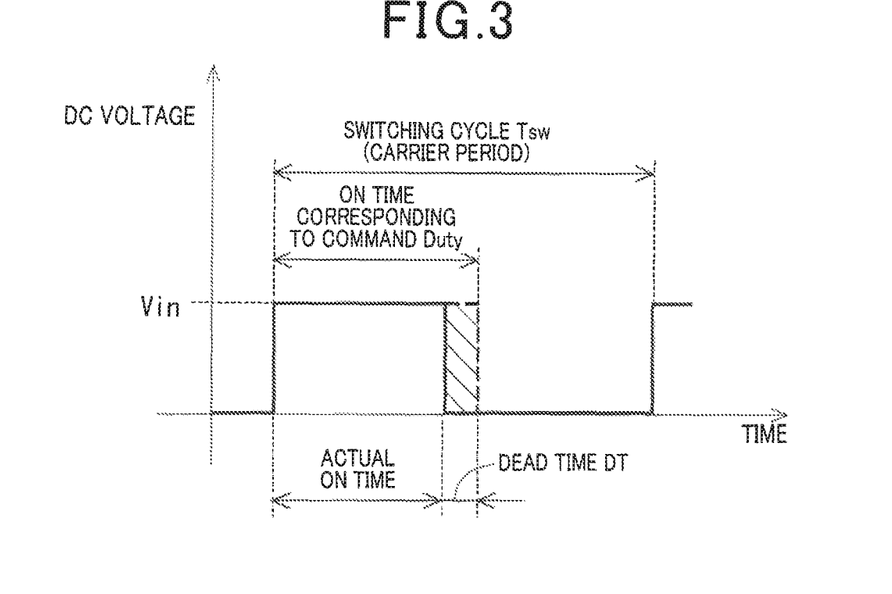
FIG. 3 is a diagram illustrating the correction amount of voltage in dead time.

FIG. 3 illustrates a relationship between the input voltage Vin and the command Duty in a switching cycle Tsw. Under the PWM control, the switching cycle Tsw agrees with a carrier period of a PWM carrier signal. Since a dead time DT is present in the switching cycle Tsw, an actual on time becomes shorter than the ON time corresponding to the command Duty. The area of the shaded portion in FIG. 3 is the product of the dead time DT and the input voltage Vin.

In the feedback control, the command Duty is calculated so as to correct a voltage difference generated by the dead time, The dead time correction amount V_dead is expressed by the expression (1). Note that the coefficient (√3) is used for three-phase AC.

$$V\_dead = (\sqrt{3}) \times (DT/Tsw) \times Vin \quad (1)$$

In the present embodiment, an input voltage estimated value Vin_est is calculated focusing on the dead time correction amount V_dead to determine an abnormality of the input voltage sensor 5. The details are described later.

The three-phase to two-phase converter 31 receives phase current detection values from the current sensors 72 and 73. In FIG. 2, the three-phase to two-phase converter 31 receives detection values of a V phase current Iv and a W phase current Iw and estimates the remaining U phase current by Kirchhoff's law. However, currents of any two phases may be detected, or currents of three phases may be detected. Alternatively, based on a current detection value of one phase, currents of other two phases may be estimated.

The three-phase to two-phase converter 31 converts the three phase currents to the dq axis currents Id and Iq based on the electrical angle θe, and feeds the dq axis currents Id and Iq back to the current subtracter 22.

Next, specific configurations of the present embodiment will be described.

The theoretical voltage command calculation section 24 calculates theoretical voltage commands Vd_thr and Vq_thr by using voltage equations as motor model expressions. The voltage equations are expressed by the expressions (2.1) and (2.2). According to the voltage equations, dq axis voltage values are calculated based on the dq axis current values and an electrical angular velocity.

$$Vd = R \times Id + Ld \times (d/dt)Id - \omega \times Lq \times Iq \quad (2.1)$$

$$Vq = R \times Iq + Lq \times (d/dt)Iq + \omega \times Ld \times Id + \omega \times \phi \quad (2.2)$$

where
R: winding resistance
Ld, Lq: d axis inductance, q axis inductance
ω: electrical angular velocity (or the number of revolutions)
φ: back electromotive voltage constant The sign ω originally indicates an electrical angular velocity that a rotation number calculation section 87 calculates by differentiating the electrical angle θe by time. Note that, herein, the sign ω also indicate the number of revolutions ω, which indicates the number of revolutions [1/s] converted from the electrical angular velocity ω [rad/s]. Note that, in FIG. 2, although the rotation number calculation section 87 is provided outside the MG controller 20 as in the electrical angle calculation section 86, the number of revolutions ω may be calculated in the MG controller 20.

In addition, the winding resistance R, the dq axis inductances Ld and Lq, and the back electromotive voltage constant φ, which are equipment constants of the MG 80, may be fixed values or may be calculated. Alternatively, the winding resistance R, the dq axis inductances Ld and Lq, and the back electromotive voltage constant φ may be calculated based on the torque command trq* or the dq axis current commands Id* and Iq* with mapping values close to actual characteristics or measured values.

The dq axis current commands calculated from the expressions (3.1) and (3.2) are referred to as theoretical voltage commands Vd_thr and Vp_thr. The expressions (3.1) and (3.2) are established by ignoring the time differential (d/dt) term, which expresses transient characteristics, in the expressions (2.1) and (2.2), and using the dq axis current commands Id* and Iq* as the dq axis currents.

$$Vd\_thr = R \times Id^* - \omega \times Lq \times Iq^* \quad (3.1)$$

$$Vd\_thr = R \times Iq^* + \omega \times Ld \times Id^* + \omega \times \phi \quad (3.2)$$

The theoretical voltage commands Vd_thr and Vp_thr calculated by the theoretical voltage command calculation section 24 are obtained by the theoretical voltage command amplitude calculation section 28.

In addition, as shown by broken lines in FIG. 2, the theoretical voltage commands Vd_thr and Vp_thr may be used as feedforward terms ("FF term" in the figure) and be added to the feedforward terms calculated by the voltage command calculation section 23. In other words, according to the configuration using feedforward terms in the MG controller 20 for improving responsivity, the theoretical voltage command amplitude calculation section 28 can calculate a theoretical voltage command amplitude Vamp_thr by using values of the feedforward terms.

The control voltage command amplitude calculation section 27 calculates a control voltage command amplitude Vamp_ctrl from the expression (4.1) based on the control voltage commands Vd* and Vq*.

$$Vamp\_ctrl = \sqrt{(Vd^{*2} + Vq^{*2})} \quad (4.1)$$

The theoretical voltage command amplitude calculation section 28 calculates the theoretical voltage command amplitude Vamp_thr from the expression (4.2) based on the theoretical voltage commands Vd_thr and Vq_thr.

$$Vamp\_thr = \sqrt{(Vd\_thr^2 + Vq\_thr^2)} \quad (4.2)$$

Figure 4:
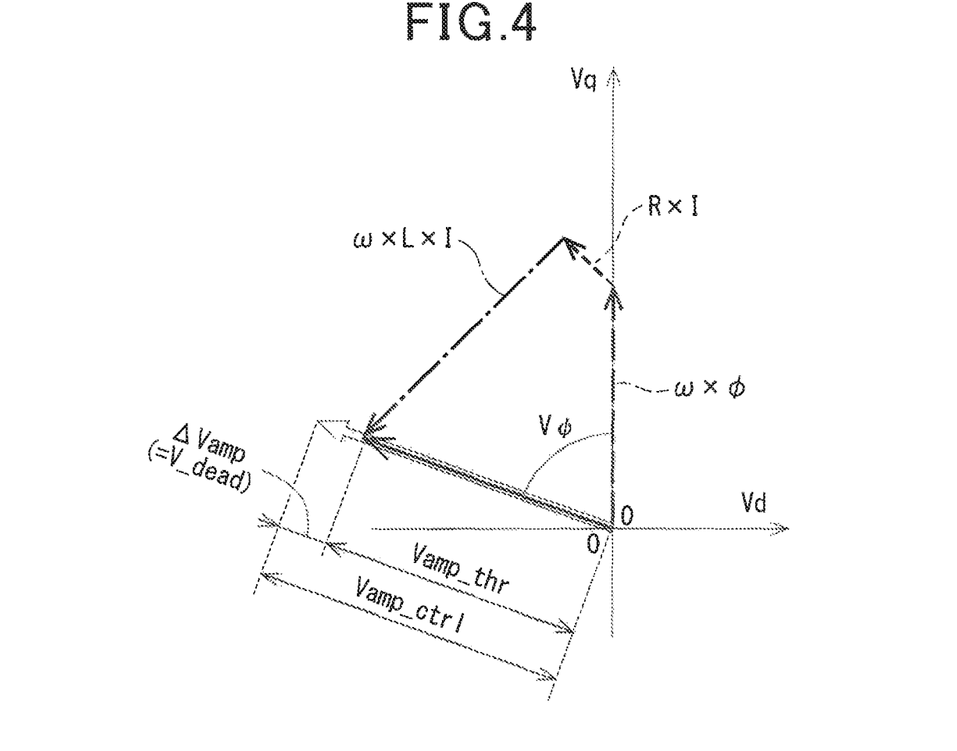
FIG. 4 is a dq axis voltage vector diagram illustrating a control voltage command amplitude and a theoretical voltage command amplitude.

In the dq axis voltage vector diagram of FIG. 4, a theoretical voltage command vector is indicated by a thick solid arrow, and a control voltage command vector is indicated by a block arrow.

The theoretical voltage command vector is expressed as a synthetic vector of a back electromotive voltage vector ($\omega \times \phi$), a winding resistance voltage ($R \times I$), and a synchronous inductance voltage ($\omega \times L \times I$) corresponding to terms of the expressions (3.1) and (3.2). The magnitude of the vector is the theoretical voltage command amplitude Vamp_thr. Note that although the phase V$\phi$ of the vector is indicated with reference to the q axis, the phase may be defined with reference to the d axis.

The control voltage command vector has the phase same as that of the theoretical voltage command vector and the amplitude Vamp_ctrl is slightly larger than the theoretical voltage command amplitude Vamp_thr.

Hereinafter, the difference obtained by subtracting the theoretical voltage command amplitude Vamp_thr from the control voltage command amplitude Vamp_ctrl is referred to as a voltage command amplitude deviation ,Vamp. If assuming that the input voltage sensor 5 is normal, and the feedback control is properly performed, it can be considered that the voltage command amplitude deviation ΔVamp is generated due to only the voltage difference generated by the dead time DT. Hence, as shown in the expression (5), the voltage command amplitude deviation ΔVamp becomes equal to the dead time correction amount V_dead.

$$\Delta Vamp = Vamp\_ctrl - Vamp\_thr = V\_dead \quad (5)$$

Next, the configuration of the voltage sensor abnormality diagnosis apparatus 40 will be described.

The voltage sensor abnormality diagnosis apparatus 40 has an input voltage estimated value calculation section 45 and an abnormality determination section 46. In the figures, the input voltage estimated value is referred to as a Vin estimated value. The input voltage estimated value calculation section 45 obtains the control voltage command amplitude Vamp_ctrl from the control voltage command amplitude calculation section 27 and obtains the theoretical voltage command amplitude Vamp_thr from the theoretical voltage command amplitude calculation section 28. In addition, the input voltage estimated value calculation section 45 obtains the switching cycle Tsw and the dead time DT from the PWM signal generator 26.

Substituting the expression (5) in the above expression (1) obtains the expression (6.1).

$$V_{in\_est} = \frac{Tsw}{\sqrt{3} \times DT} \times (V_{amp\_ctrl} - V_{amp\_thr}) \quad (6.1)$$

Note that the expression (6.1) can be expressed as the expressions (6.2) and (6.3) by using a conversion coefficient K determined from the switching cycle Tsw and the dead time DT.

$$Vin\_est = K \times \Delta Vamp \quad (6.2)$$

$$K = Tsw / \{(\sqrt{3}) \times DT\} \quad (6.3)$$

From the expression (6.1), the input voltage estimated value calculation section 45 calculates the input voltage estimated value Vin_est by multiplying the voltage command amplitude deviation ΔVamp, which is obtained by subtracting the theoretical voltage command amplitude Vamp_thr from the control voltage command amplitude Vamp_ctrl, by K.

The abnormality determination section 46 obtains an input voltage sensor value Vi_sns, and the input voltage estimated value Vin_est calculated by the input voltage estimated value calculation section 45. Then, if the absolute value of the difference between the input voltage sensor value Vi_sns and the estimated value Vin_est is larger than a voltage threshold value Ith, the abnormality determination section 46 determines that the input voltage sensor 5 is abnormal.

In addition, when the abnormality determination is fixed, the abnormality determination section 46 may output the input voltage estimated value Vin_est to the PWM signal generator 26 as indicated by a broken line.

Figure 5:
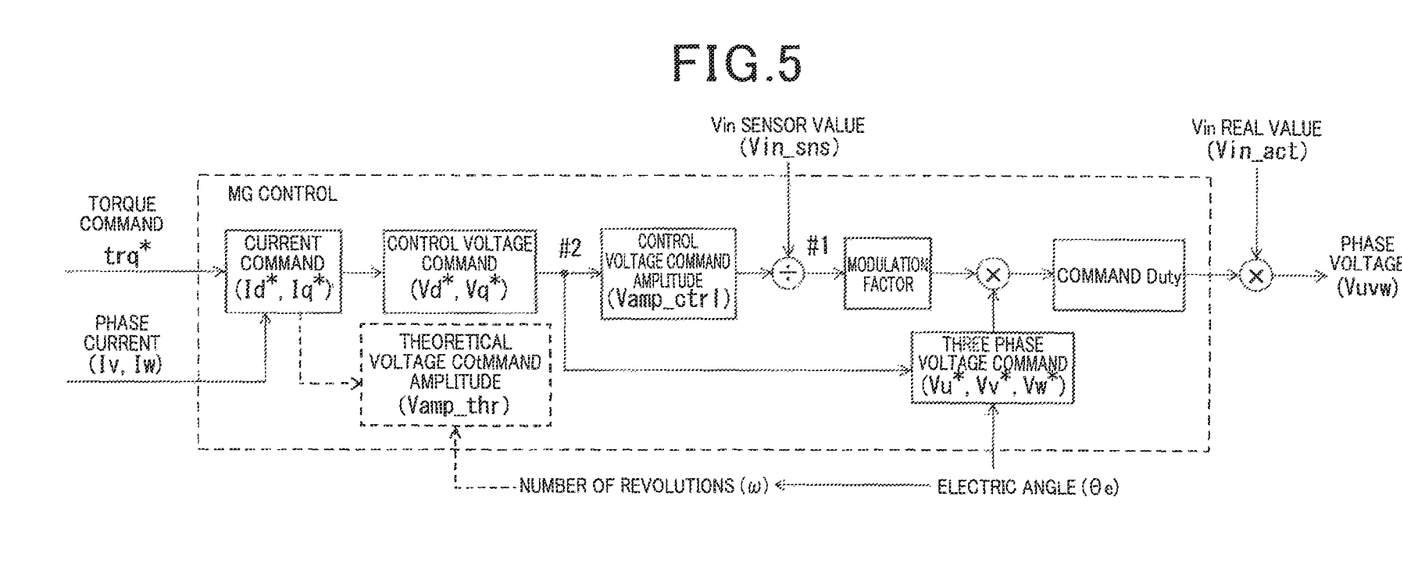
FIG. 5 is a flow diagram of a control operation executed by the MG controller.

Next, the flow diagram of a control operation executed by the MG controller 20 is shown in FIG. 5. Although functions of blocks in FIG. 2 are individually described, a series of flow of the control operation will be described with reference to FIG. 5 while specifically being careful about the influence of feedback variables. The configuration in the broken line frame corresponds to the MG controller 20.

Under the MG control, first, the phase currents Iv and Iw are fed back to the current commands Id* and Iq*, which are calculated based on the torque command trq* issued from the outside to calculate the control voltage commands Vd* and Vq*. On a branch line, the theoretical voltage command amplitude Vamp_thr is calculated for the current commands Id* and Iq* and based on the number of revolutions ω.

On a direct line, a modulation factor is calculated by dividing the amplitude Vamp_ctrl of the control voltage commands Vd* and Vq* by the input voltage sensor value Vi_sns. The calculation portion is referred to as #1.

In addition, going back slightly, the control voltage command amplitude Vamp_ctrl varies with a positive correlation with the variations of the control voltage commands Vd* and Vq*. The variation portion is referred to as #2.

In later descriptions, #1 and #2 are referred to.

Meanwhile, the three phase voltage commands Vu*, Vv*, and Vw* are calculated based on the control voltage commands Vd* and Vq* and the electrical angle θe, It is assumed that the block of the three phase voltage commands includes information on voltage phase Vφ. Multiplying the modulation factor by three phase voltage commands can obtain the command Duty.

On the right side of the frame, an output generated by actual drive of the inverter 60 based on the command Duty is indicated. The product of an input voltage real value Vin_act actually inputted to the inverter 60 and the command Duty is outputted as a phase voltage Vuvw.

Hereinafter, technical ideas of the control voltage command amplitude Vamp_ctrl and the theoretical voltage command amplitude Vamp_thr according to the present embodiment will be summarized.

The control voltage command amplitude Vamp_ctrl corresponds to the amplitude of the control voltage commands Vd* and Vq* generated by the feedback control in the MG control. Without using the input voltage sensor value Vi_sns, a voltage value can be obtained which is automatically corrected with the dead time correction amount V_dead.

The theoretical voltage command amplitude Vamp_thr corresponds to the amplitude of the theoretical voltage commands Vd_thr and Vq_thr generated based on voltage equations, which are motor model expressions. The input voltage sensor value Vi_sns is not used. In addition, the dead time correction amount V_dead is not considered.

Note that a case can be considered where the control voltage command amplitude Vamp_ctrl considering the dead time correction amount V_dead is previously obtained by actual measurement or a simulation depending on the number of revolutions ω and the torque command trq* so as to be prepared as a map or the like. In this case, the input voltage estimated value calculation section 45 calculates the input voltage estimated value Vin_est based on the control voltage command amplitude Vamp_ctrl obtained from the is map or the like and the theoretical voltage command amplitude Vamp_thr.

Next, with reference to the time charts of FIG. 6, an example of a voltage sensor abnormality diagnosis will be described.

Figure 6:
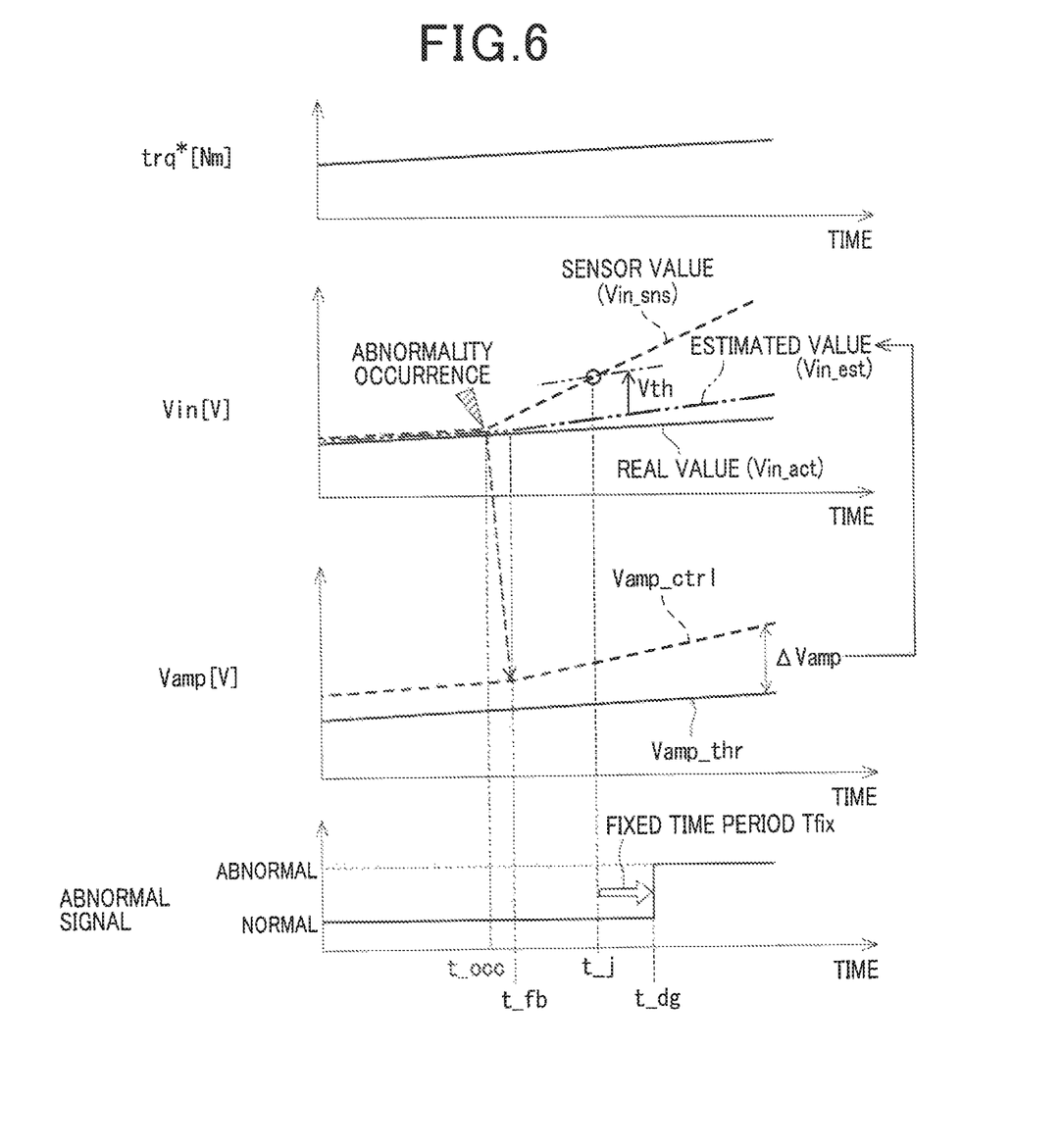
FIG. 6 includes time charts illustrating behavior when an abnormality of a voltage sensor occurs.

Vertical axes in FIG. 6 indicate, from the top, the torque command trq*, the sensor value Vi_sns of the input voltage Vin, the real value Vin_act of the input voltage Vin, the estimated value Vin_est of the input voltage Vin, the control voltage command amplitude Vamp_ctrl, the theoretical voltage command amplitude Vamp_thr, and an abnormality signal.

The torque command trq* indicates that an MG request output gradually increases during the abnormality diagnosis period.

In the premise that the dead time DT is present, the control voltage command amplitude Vamp_ctrl becomes larger than the theoretical voltage command amplitude Vamp_thr. Then, from the expression (6.1), the input voltage estimated value Vin_est is calculated which is proportional to the voltage command amplitude deviation ΔVamp obtained by subtracting the theoretical voltage command amplitude Vamp_thr from the control voltage command amplitude Vamp_ctrl.

The range in which the voltage threshold value Vth is offset with respect to the input voltage estimated value Vin_est is indicated by a thin long and two short dashes line in the figure. The state in which the absolute value of the difference between the input voltage estimated value Vin_est and the sensor value Vi_sns is the voltage threshold value Vth or lower is considered as a normal range of the input voltage sensor 5.

During an early stage of the time chart, the input voltage sensor 5 is normal, and the input voltage sensor value Vin_sns, the real value Vin_act, and the estimated value Vin_est increase together. The control voltage command amplitude Vamp_ctrl and the theoretical voltage command amplitude Vamp_thr slightly increase with maintaining a constant ratio.

Then, an abnormality occurs at the time t_occ. Here, it is assumed that an abnormality has occurred in which the sensor value Vi_sns becomes larger than the real value Vin_act.

After the abnormality occurrence time t_occ, the rate of increase of the sensor value Vi_sns becomes higher than the rate of increase of the input voltage real value Vin_act.

As seen in #1 of FIG. 5, as the sensor value Vi_sns, which is the denominator, becomes larger, the command Duty becomes smaller. Since the command Duty is reduced, current does not flow to the MG 80. Then, the current feedback control calculates the control voltage commands Vd* and Vq* so as to be larger at the next calculation time t_fb.

As seen in #2 of FIG. 5, as the control voltage commands Vd* and Vq* become larger, the control voltage command amplitude Vamp_ctrl becomes larger, whereby the rate of increase increases. In contrast, the rate of increase of the theoretical voltage command amplitude Vamp_thr, which is not depending on the feedback, does not vary. Hence, after the feedback calculation time the control voltage command amplitude Vamp_ctrl and the theoretical voltage command amplitude Vamp_thr gradually diverge from each other.

Thereby, although the input voltage estimated value Vin_est increases, the amount of increase thereof is smaller than the amount of increase of the sensor value Vi_sns. As a result, the difference between the input voltage sensor value Vi_sns and the estimated value Vin_est widens. Then, at the time t_j when the absolute value of the difference between the input voltage sensor value Vin_sns and the estimated value Vin_est exceeds the voltage threshold value Vth, the presence of an abnormality is determined. Then, at the time t_dg until which the state where the presence of an abnormality is determined has continued for a fixed time period Tfix, the determination of an abnormality of the input voltage sensor 5 is fixed, and an abnormality signal is generated.

In contrast, when an abnormality has occurred in which the sensor value Vi_sns becomes smaller than the real value Vin_act, the amount of decrease of the input voltage sensor value Vi_sns becomes larger than the amount of decrease of the estimated value Vin_est. Then, at the time t_j when the absolute value of the difference between the input voltage sensor value Vin_sns and the estimated value Vin_est exceeds the voltage threshold value Vth, an abnormality is similarly determined.

Next, with reference to the flowchart of FIG. 7, an abnormality diagnosis process performed by the voltage sensor abnormality diagnosis apparatus 40 will be described. This abnormality diagnosis process is repeatedly executed while the MG controller 20 operates. In the flowchart, the sign S indicates a step.

In the steps described below, S23 to S28 identify execution subjects. In S21 and S22, the whole voltage sensor abnormality diagnosis apparatus 40 is an execution subject. In S29, in particular, the MG controller 20 is an execution subject.

In S21, the voltage sensor abnormality diagnosis apparatus 40 determines whether or not the power supply relay 12 is in a connected state. If NO is determined, the process is ended.

In S22, the voltage sensor abnormality diagnosis apparatus 40 determines whether or not the current state of the system is in a stable region.

The stable region is a region where a rate of change of a drive condition of the MG 80 is within a predetermined range, that is, a region where a sudden change has not been caused. The drive condition for monitoring the rate of change includes the control voltage commands Vd* and Vq*, which is typical, the amplitude Vamp_ctrl and the phase Vϕ of the control voltage command vector, and the current commands Id* and Iq*. Alternatively, a rate of change of the number of revolutions or torque of the MG may be monitored. In addition, the stable region may be set only during the sinusoidal PWM control, except when the MG control mode is an overmodulation PWM control mode and a rectangular wave control mode, The range of the rate of change set as the stable region and a monitoring period may be appropriately set depending on error ranges of parameters, the resolution of the controller, or the like.

If YES in S22, the process proceeds to the next step. If NO, the determination is repeated until a stable region is determined.

In S23 and S24, the input voltage estimated value calculation section 45 obtains the control voltage command amplitude Vamp_ctrl from the control voltage command amplitude calculation section 27 and obtains the theoretical voltage command amplitude Vamp_thr from the theoretical voltage command amplitude calculation section 28. In addition, in S25, the input voltage estimated value calculation section 45 obtains the switching cycle Tsw and the dead time DT from the PWM signal generator 26. S23, S24, and S25 are in random order.

In S26, the input voltage estimated value calculation section 45 uses the obtained information to calculate the input voltage estimated value Vin_est from the expression (6. 1).

In S27, the abnormality determination section 46 obtains the input voltage sensor value Vi_sns and the input voltage estimated value Vin_est. If the absolute value of the difference therebetween is larger than the voltage threshold value Vth, the abnormality determination section 46 determines that the input voltage sensor 5 is abnormal. Then, the abnormality determination section 46 determines whether or not the abnormal state in which the absolute value of the difference between the input voltage sensor value Vi_sns and the estimated value Vin_est is larger than the voltage threshold value Vth has continued for a predetermined fixed time period or more. If YES in S27, in S28, the abnormality determination section 46 definitely determines the abnormality of the input voltage sensor 5.

In contrast, if NO in S27, it is likely that the input voltage sensor value Vi_sns and the estimated value Vin_est is displaced from each other due to a temporally disturbance or the like, resulting in determining an abnormal state. Hence, the abnormality determination section 46 does not definitely determine the abnormality. Then, the process is ended.

Note that the detailed logic may be appropriately set in which an abnormality is definitely determined only when an abnormal state has continued for a fixed time period or even when an accumulated time during a certain time period has reached the fixed time period though the abnormal state has been interrupted In addition, if an abnormality of the input voltage sensor 5 is definitely determined, the abnormality determination section 46 outputs the input voltage estimated value Vin_est to the PWM signal generator 26.

In S29, the MG controller 20 can continue to drive the MG 80 by using the input voltage estimated value Vin_est instead of the input voltage sensor value Vi_sns. For example, in a hybrid car, evacuation travel can be continued.

Note that, for example, in another example, when the MG controller 20 is applied to a system having little needs for continuing motor drive, the motor drive may be stopped when an abnormality of the input voltage sensor 5 is definitely determined.

Advantageous effects of the present embodiment will be described, (1) According to the conventional art disclosed in Japanese Patent No.4793058, an abnormality of an inverter input voltage sensor is determined by comparing a first output estimated value, which is the three-phase sum of products of phase currents and phase voltages of individual phases, with a second output estimated value, which is calculated based on the product of torque and the number of revolutions of a motor. According to this determination method, since voltage values are not directly evaluated, it is difficult to secure uniform accuracy in determining an abnormality in a wide voltage region.

In contrast, according to the present embodiment, an abnormality of the input voltage sensor 5 is determined by directly calculating the input voltage estimated value Vin_est based on the control voltage command amplitude Vamp_ctrl and the theoretical voltage command amplitude Vamp_thr and by comparing the input voltage estimated value Vin_est with the sensor value Vin_act. Hence, the accuracy in determining an abnormality of the input voltage sensor 5 can be secured in a wide voltage region.

Specifically, the drive system of the MG 80, which is a power source of a hybrid car or an electric car, is required to perform control with high accuracy to achieve good drivability in a state where the output required for the MG 80 significantly changes depending on the driving condition of the vehicle. Hence, it is advantageous to appropriately diagnose an abnormality of the input voltage sensor 5 by using the present embodiment.

(2) According to the conventional art disclosed in Japanese Patent No.4793058, sensor values of the battery voltage sensor and the inverter input voltage sensor are compared with each other to determine which of the voltage sensors is abnormal.

In contrast, according to the present embodiment, a battery voltage signal is not required to be used for determining an abnormality of the input voltage sensor. Hence, in the system in which output voltage of the battery 11 is directly inputted to the inverter 60, setting of the battery voltage sensor and communication of a battery voltage signal are not required.

Figure 7:
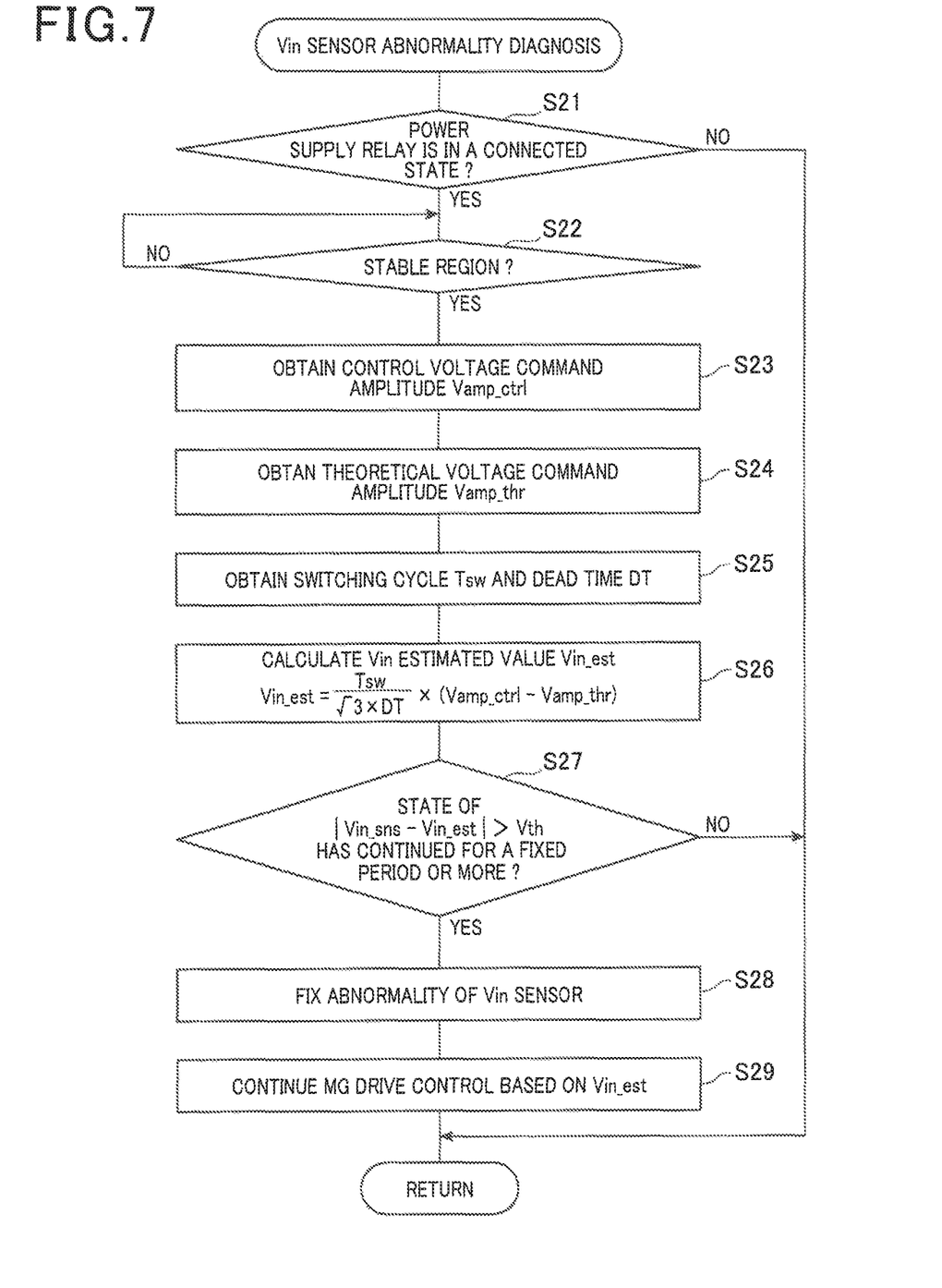
FIG. 7 is a flowchart of voltage sensor abnormality diagnosis.

(3) In S29 in the flowchart of FIG. 7, when the input voltage sensor 5 is determined to be abnormal, the MG controller 20 can continue to drive the MG 80 by using the input voltage estimated value Vin_est. Hence, a situation can be appropriately avoided in which the drive of the MG 80 immediately becomes impossible due to the occurrence of an abnormality in the input voltage sensor 5.

(4) In S22 in the flowchart of FIG. 7, executing the abnormality diagnosis process only in the stable region can eliminate the influence of disturbances and sensor errors, whereby an abnormality can be determined with high accuracy. As a result, erroneous determinations can be prevented. In addition, the fixed time period for definitely determining the abnormality can be shortened.

(Other embodiments)

(1) In FIG. 1, a system configuration including one MG is illustrated. However, the present invention can be similarly applied to a system including two or more MGs. Specifically, the present invention can be applied to, for example, a series-parallel hybrid car including an MG1 mainly functioning as a generator and an MG2 mainly functioning as a motor. In this case, two inverters individually driving the and MG2 are provided in parallel. The inverter input voltage Vin is inputted to the two inverters in common. Hence, providing the voltage sensor abnormality diagnosis apparatus to a circuit controlling current application to any one of the MGs can diagnose an abnormality.

(2) The voltage sensor abnormality diagnosis apparatus of the present invention may be applied to an input voltage sensor, which detects voltage after step-up, in not only a system in which output voltage of a battery is directly inputted to an inverter but also, for example, a system in which a step-up converter is provided between a battery and an inverter.

In this case, since battery voltage information is required for step-up control, a battery voltage sensor cannot be removed in essence. However, the advantageous effect of securing accuracy in determining an abnormality of an inverter input voltage sensor can be obtained as in the above embodiment.

(3) The AC motor driven in a motor drive system to which the present invention is applied may not have a function as a generator which the MG of the above embodiment has. In addition, not only the permanent magnet synchronous motor but also an induction motor or other synchronous motors may be employed. The number of phases of the rotor of the multiphase AC motor may be four or more.

Furthermore, the present invention may be applied to not only the MG drive system of a hybrid car or an electric car but also motor drive systems for any use, for example, for general machinery.

(4) In the above embodiment, the theoretical voltage command amplitude calculation section 27 calculates the theoretical voltage command amplitude Vamp_thr based on the theoretical voltage commands Vd_thr and Vq_thr calculated from the dq axis currents Id and Iq and the number of revolutions ω by using the voltage equations. Alternatively, the theoretical voltage command amplitude calculation section 27 may calculate the theoretical voltage command amplitude Vamp_thr based on three phase voltage commands by using a three phase model expression (7) as a motor model expression other than the voltage equations, Note that the voltage equations and the three phase model expression may be calculated with reference to a map.

$$\begin{bmatrix} Vu \\ Vv \\ Vw \end{bmatrix} = \begin{bmatrix} R+pL_u & pM_{uv} & pM_{wu} \\ pM_{uv} & R+pL_v & pM_{vw} \\ pM_{wu} & pM_{vw} & R+pL_w \end{bmatrix} \cdot \begin{bmatrix} Iu \\ Iv \\ Iw \end{bmatrix} - \omega\phi \begin{bmatrix} \sin\theta_e \\ \sin\left(\theta_e - \dfrac{2\pi}{3}\right) \\ \sin\left(\theta_e - \dfrac{2\pi}{3}\right) \end{bmatrix} \quad (7)$$

where
p: differential operator
R: winding resistance
L: self inductance
M: mutual inductance ω: electrical angular velocity (or the number of revolutions) ϕ: back electromotive voltage constant
Note that subscripts of L and M indicate a phase or interphase.

(5) The switching signal driving the inverter 60 is not limited to a PWM pulse signal generated by comparing the command duty with a carrier signal but may be a signal complementarily turning on and off the pairs of the switching elements of the upper and lower arms in switching cycles Tsw. For example, an optimum pattern selected from a predetermined plurality of pulse patterns depending on the modulation factor may be used as a switching signal in synchronism with an electrical angle cycle. Even when a pulse pattern is used, a dead time is provided as in a PWN signal, and the voltage sensor abnormality diagnosis of the above embodiment can be applied.

It will be appreciated that the present invention is not limited to the configurations described above, but any and all modifications, variations or equivalents, which may occur to those who are skilled in the art, should be considered to fall within the scope of the present invention.

Hereinafter, aspects of the above-described embodiments will be summarized.

The present embodiment relates to a voltage sensor abnormality diagnosis apparatus, which is applied to a motor controller (20) controlling current application to a three phase or more multiple AC motor (80) driven by AC power supplied from an inverter (60) connected to a DC power (11), and diagnoses an abnormality of an input voltage sensor (5) detecting an inverter input voltage (Vin) inputted to the inverter.

Here, the motor controller operates switching of the inverter by a switching signal, which is calculated based on a voltage command calculated by current feedback control and complementarily turns on and off a pair of switching elements of a plurality of upper and lower arms configuring the inverter in a switching cycle, The voltage sensor abnormality diagnosis apparatus of the present embodiment includes an input voltage estimated value calculation section (45) and an abnormality determination section (46).

The input voltage estimated value calculation section calculates an input voltage estimated value (Vin_est) by multiplying a voltage command amplitude deviation (ΔVamp) by a conversion coefficient, the voltage command amplitude deviation being obtained by subtracting a theoretical voltage command amplitude (Vamp_thr) from a control voltage command amplitude (Vamp_ctrl).

Here, the control voltage command amplitude is an amplitude of a control voltage command calculated by feedback control and has been corrected by the correction amount of voltage in dead time provided between on periods of the pair of the switching elements. In addition, the theoretical voltage command amplitude is an amplitude of a theoretical voltage command calculated by using a motor model expression.

The abnormality determination section determines that the input voltage sensor is abnormal if the absolute value of the difference between the input voltage estimated value and an input voltage sensor value (Vin_sns), which is a detection value of the input voltage sensor, is larger than a voltage threshold value (Vth), Provided that the AC motor is a three-phase AC motor, the conversion coefficient is calculated from the following expression:

$K = Tsw/\{(\sqrt{3})+DT\}$ where
K is the conversion coefficient, Tsw is the switching cycle, and DT is the dead time.

In addition, provided that the AC motor is a three-phase AC motor, and the motor controller performs vector control for converting three phase axes to dq axes, a voltage equation calculating a dq axis voltage value based on a dq axis current value and an electrical angular velocity is used as the motor model expression.

In the present embodiment, the input voltage estimated value is calculated and is directly compared with the sensor value to determine an abnormality of the input voltage sensor. Hence, the voltage threshold value can be easily determined based on the specification or the like of the input voltage sensor. In addition, with reference to the voltage threshold value, accuracy in determining an abnormality of the input voltage sensor can be secured in a wide voltage region.

In addition, in the present embodiment, a battery voltage signal is not required to be used for determining an abnormality of the input voltage sensor. Specifically, in a system in which output voltage of a battery is directly inputted to an inverter, setting of a battery voltage sensor and communication of the battery voltage signal are not required.

Furthermore, in the present embodiment, the input voltage estimated value can be calculated based on the control voltage command amplitude and the theoretical voltage command amplitude.

Hence, even when the input voltage sensor is determined to be abnormal, the drive of the AC motor can be continued by using the input voltage estimated value.

What is claimed is:

1. A voltage sensor abnormality diagnosis apparatus, which is applied to a motor controller controlling current application to a three phase or more multiple AC motor driven by AC power supplied from an inverter connected to a DC power, and diagnoses an abnormality of an input voltage sensor detecting an inverter input voltage inputted to the inverter, wherein the motor controller operates switching of the inverter by a switching signal, which is calculated based on a voltage command calculated by current feedback control and complementarily turns on and off a pair of switching elements of a plurality of upper and lower arms configuring the inverter in a switching cycle, and the apparatus comprises:

an input voltage estimated value calculation section that calculates an input voltage estimated value by multiplying a voltage command amplitude deviation by a conversion coefficient, the voltage command amplitude deviation being obtained by subtracting a theoretical voltage command amplitude, which is an amplitude of a theoretical voltage command calculated by using a motor model expression, from a control voltage command amplitude, which is an amplitude of a control voltage command calculated by feedback control and has been corrected by the correction amount of voltage in dead time provided between on periods of the pair of the switching elements; and an abnormality determination section that determines that the input voltage sensor is abnormal if an absolute value of a difference between the input voltage estimated value and an input voltage sensor value, which is a detection value of the input voltage sensor, is larger than a voltage threshold value.

2. The voltage sensor abnormality diagnosis apparatus, according to claim 1, wherein the AC motor is a three-phase AC motor, and
the conversion coefficient is calculated from the following expression:

$$K = Tsw / \{(\sqrt{3}) \times DT\}$$

where
K is the conversion coefficient, Tsw is the switching cycle, and DT is the dead time.

3. The voltage sensor abnormality diagnosis apparatus, according to claim 1, wherein the AC motor is a three-phase AC motor,
the motor controller performs vector control for converting three phase axes to dq axes, and
the motor model expression is a voltage equation calculating a dq axis voltage value based on a dq axis current value and an electrical angular velocity.

4. The voltage sensor abnormality diagnosis apparatus, according to claim 3, wherein the motor controller calculates a feedforward term of a dq axis voltage command by using a voltage equation in which a dq axis current command value is used as a dq axis current value, and
the theoretical voltage command amplitude is calculated by using a value of the feedforward term.

5. The voltage sensor abnormality diagnosis apparatus, according to claim 1, wherein the motor controller operates switching of the inverter by PWM control, and
the switching cycle agrees with a carrier period of a PWM carrier signal.

6. The voltage sensor abnormality diagnosis apparatus according to claim 1, wherein in a stable region that is a region where a rate of change of a drive condition of the AC motor is within a predetermined range, an abnormality of the input voltage sensor is diagnosed.

7. The voltage sensor abnormality diagnosis apparatus, according to claim 6, wherein the stable region is a region where a rate of change of a voltage command or a current command is within a predetermined range.

* * * * *